(12) United States Patent
Hussin

(10) Patent No.: US 12,174,228 B2
(45) Date of Patent: Dec. 24, 2024

(54) THERMOELECTRIC POWER METER

(71) Applicant: Keysight Technologies, Inc., Santa Rosa, CA (US)

(72) Inventor: Ghazali Bin Hussin, Pulau Pinang (MY)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 172 days.

(21) Appl. No.: 17/887,596

(22) Filed: Aug. 15, 2022

(65) Prior Publication Data
US 2024/0053389 A1    Feb. 15, 2024

(51) Int. Cl.
| G01R 22/04 | (2006.01) |
| G01R 19/32 | (2006.01) |
| G01R 21/02 | (2006.01) |
| G01R 21/14 | (2006.01) |

(52) U.S. Cl.
CPC ............ *G01R 22/04* (2013.01); *G01R 21/02* (2013.01); *G01R 21/14* (2013.01); *G01R 19/32* (2013.01)

(58) Field of Classification Search
CPC ........ G01R 22/04; G01R 21/02; G01R 21/14; G01R 19/32
USPC ......................................................... 324/141
See application file for complete search history.

(56) References Cited

U.S. PATENT DOCUMENTS

| 2,565,922 | A | * | 8/1951 | Howard | ................. G01R 21/00 324/123 R |
| 3,267,376 | A | | 8/1966 | Harries | |
| 3,521,165 | A | * | 7/1970 | Visser | .................... G01R 19/03 324/106 |
| 6,459,254 | B1 | | 10/2002 | Mazzochette et al. | |
| 2006/0237416 | A1 | * | 10/2006 | Twerdochlib | ........ H05B 1/0213 219/201 |
| 2007/0176768 | A1 | | 8/2007 | Scott | |

OTHER PUBLICATIONS

Jonathan B. Scott et al., "New Thermocouple-Based Microwave/mmWave Power Sensor MMIC Techniques in GaAs", IEEE Transactions on Microwave Theory and Techniques, 2011, vol. 59, Issue: 2, pp. 1-6.

* cited by examiner

*Primary Examiner* — Eman A Alkafawi
*Assistant Examiner* — Rahul Maini

(57) ABSTRACT

An apparatus and a system measure electrical power with improved accuracy as a result of compensating for sources of thermal energy that are not caused by the electrical power of the electrical circuit under test. The apparatuses and systems provide a separate electrical signal source (e.g. RF electrical circuits under test) and DC sides. The apparatuses and systems include devices adapted to convert thermal energy into voltages having reversed polarities. The apparatuses and systems are adapted to compensate for temperature changes not caused by the electrical power of the electrical circuit under test (e.g., ambient temperature change and thermal energy transmitted through the signal transmission lines from sources in the electrical circuit).

20 Claims, 3 Drawing Sheets

THERMOELECTRIC POWER METER

BACKGROUND

Power meters are used in many applications, such as in radio frequency (RF) or other frequency band applications. Many of the known power meters used in RF power measurements are adversely impacted by thermal changes, which in turn adversely impact the measurement accuracy from the power meters.

Sources of heat that can adversely impact the accuracy of power measurements include ambient temperature changes where the power meter is disposed, and thermal energy generated by the electrical circuit under test. The ambient temperature change results in a change in the output voltage of the RF power meter that is unrelated, of course, to the output power of the electrical circuit under test. The electrical circuit under test includes signal transmission lines (e.g., coaxial cables and planar transmission lines) that conduct heat from the electrical circuit, such as an power source, which heats up during operation. The temperature changes caused by the heat conducted by the signal transmission lines also results in a change in the output voltage of the power meter that is unrelated, of course, to the output power of the electrical circuit under test.

As will be appreciated, the noted and other sources of heat adversely impact the performance of known RF power meters. What is needed, therefore, is an optical wavemeter that overcomes at least the shortcomings of known optical wavemeters discussed above.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
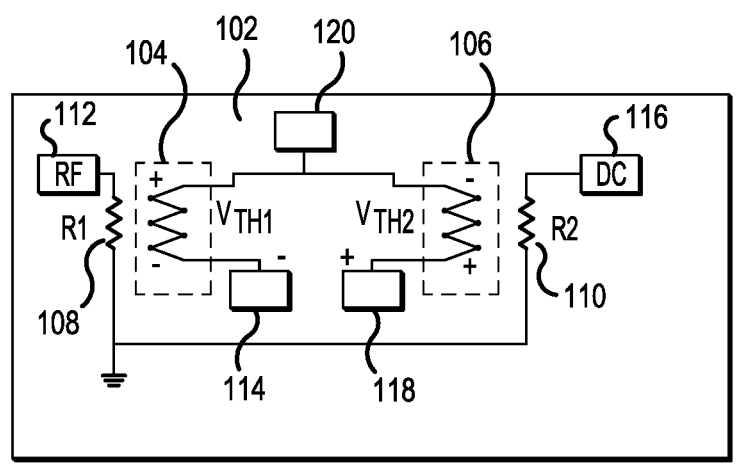
FIG. 1 is a simplified circuit diagram of an apparatus for measuring electrical power in accordance with a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element this encompasses cases where one or more intermediate elements or intervening devices may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially identical" means that one of ordinary skill in the art would consider the items being compared to be the identical.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various representative embodiments relate to an apparatus and a system for measuring electrical power with improved accuracy as a result of compensating for sources of thermal energy that are not caused by the electrical power of the electrical circuit under test. As described more fully below in accordance with various representative embodiments, the apparatuses and systems of the present teachings provide separate comparatively high frequency band electrical signal source and DC sides. The apparatuses and systems include devices adapted to convert thermal energy into voltages having reversed polarities. The apparatuses and systems of the present teachings are adapted to compensate for temperature changes not caused by the electrical power of the electrical circuit under test (e.g., ambient temperature change and thermal energy transmitted through the signal transmission lines from sources in the electrical circuit). The resultant apparatuses and systems provide improved accuracy in measurements of power of an electrical circuit under test.

In accordance with a representative embodiment, apparatus for measuring electrical power is described. The apparatus comprises: a substrate; a first device adapted to convert thermal energy into a first voltage. The first device comprises a first thermopile or a first thermocouple, and has a first input and a first output. The first device is disposed over the substrate adjacent to a first resistor. The apparatus also comprises a second device adapted to convert thermal energy into a second voltage. The second device comprises a second thermopile or a second thermocouple, and the second device has a second input and a second output. The second device is disposed over the substrate adjacent to a second resistor. Due to the reversed polarities of the first and second devices, the first output and the second output have opposite polarities. The apparatus may also comprise a source measurement unit (SMU) comprising a direct current (DC) voltage source and a DC voltmeter connected to the second resistor. The SMU provides a third voltage to the second resistor to maintain a voltage between the first and second outputs at a balanced level.

In accordance with another representative embodiment, a system for measuring electrical power is described. The system comprises: a controller comprising a processor; a tangible, non-transitory computer-readable medium that stores instructions; a substrate; a first device adapted to convert thermal energy into a first voltage, the first device comprising a first thermopile or a first thermocouple. The first device has a first input and a first output, and the first device is disposed over the substrate adjacent to a first resistor. The system also comprises a second device adapted to convert thermal energy into a second voltage. The second device comprises a second thermopile or a second thermocouple, and has a second input and a second output. The second device is disposed over the substrate adjacent to a second resistor. Due to the reversed polarities of the first and second devices, the first output and the second output have opposite polarities. The system may also comprise a source measurement unit comprising a direct current (DC) voltage source and a DC voltmeter connected to the second resistor. When executed by the processor, the processor causes the source measurement unit to provide a third voltage to the second resistor to maintain a voltage between the first and second outputs at a balanced level.

FIG. 1 is a simplified schematic diagram of an apparatus 100 in accordance with a representative embodiment. As will become clearer as the present teachings continue, the apparatus 100 may be used as a power meter or power measurement device.

The apparatus 100 is disposed over a substrate 102, and comprises a first device 104 adapted to convert thermal energy into a first voltage, and a second device 106 adapted to convert thermal energy into a second voltage. The substrate 102 is unitary, and is selected to have a substantially uniform coefficient of thermal conductivity, and thus heats and cools substantially equally when the ambient temperature changes. In accordance with a representative embodiment, the substrate 102 is selected from a material having the desired uniform heating/cooling, and may comprise silicon (Si), gallium arsenide (GaAs), and or gallium nitride (GaN). It is emphasized that the noted materials are merely illustrative, and other materials that provide the desired substantially uniform coefficient of thermal conductivity within the purview of one of ordinary skill in the art having the benefit of the present teachings are also contemplated. Notably, and as described more fully below, the various components depicted in FIG. 1 are disposed over the substrate 102.

The first device 104 and the second device 106 are substantially identical but have opposing polarities as described more fully below. In accordance with a representative embodiment, the first device 104 and the second device 106 are either thermopiles or thermocouples. Illustratively, the first and second devices 104, 106 comprise substantially identical thermocouples or thermopiles. Such substantially identical first and second devices are realized by fabricating the structures of the first and second devices 104, 106 to be symmetrical or mirror images to each other on a unity substrate (e.g., substrate 102). By fabricating the structures of the first and second devices 104, 106 this way results in the devices' having similar sensitivity to the thermal change, which is detected at the output voltage of the respective first and second devices 104, 106. Finally, it is noted that it is beneficial for the first and second resistors 108, 110 to have same magnitudes and similar temperature coefficients.

Notably, and as shown in FIG. 1, the first device 104 and the second device 106 have opposite polarities, so their voltage outputs having opposing signs. As described more fully below, this aspect of the first and second device 104, 106 is used to adjust for thermal changes caused by the ambient, heat from electrical circuitry under test, and to provide a measurement of the power from the electrical circuitry under test.

The first device 104 is disposed adjacent to a first resistor 108, and the second device 106 is disposed adjacent to a second resistor 110. Notably, the first device 104 is electrically isolated from the first resistor 108, and the second device 106 is electrically isolated from the second resistor 110. The first device 104 is disposed between a first input 112 and a first output 114. The second device 106 is connected between a second input 116 and a second output 118. A common input 120 is disposed between the first and second device 104, 106, and its function will become clearer as the present description continues.

As alluded to above, the apparatus is adapted to perform electrical measurements of an electrical circuit (not shown in FIG. 1) connected to the first device 104, and may be a circuit that operates at comparatively high frequency electrical signal frequencies. The present teachings contemplate the apparatus 100 is adapted to perform power measurements on electrical circuits in the RF, Microwave, Millimeter Wave and sub terahertz frequency ranges. For ease of description, however, the various representative embodiments are described in connection with electrical circuits that operate in the RF band. As such, the first input 112, the first device 104, the first output 114, and the first resistor 108 disposed over the substrate 102 may be referred to as the 'RF side' of the apparatus 100. By contrast, and as described more fully below, the second input 116 is connected to a direct current (DC) source that supplies power to the second input 116 that is used to adjust the operation of the apparatus to account for ambient temperature changes, temperature changes from the electrical circuit, and to provide a measure of the power dissipated from the electrical circuit connected to the first input 112. As such, the second input 116, the second device 106, the second output 118, and the second resistor disposed over the substrate 102 may be referred to as the 'DC side' of the apparatus.

As described more fully below, maintaining the voltage between the first output 114 and the second output 118 at a balanced level results in the adjustment to account for ambient temperature changes, temperature changes to the RF side caused by the electrical circuit to which it is attached, and the measure of the power dissipated from the electrical circuit connected to the first input 112. As such, when thermal energy is transferred to the first device 104, due to the function of the first device 104, a voltage $V_{TH1}$ is established. This will alter the balanced state between the first output 114 and the second output 118. Application of a voltage $V_{TH2}$ between the second input 116 and the second output 118 having the same magnitude returns the first output 114 and the second output 118 to a balanced state.

As noted above, the first device 104 and the second device 106 are selected to be substantially identical but have opposite polarities. An initial balanced state is determined by a measure of $V_{TH1}$ and $V_{TH2}$ with no power applied from the electrical circuit connected to the first input. This is effected by constructing/disposing the substantially identical first and second devices 104, 106 over substrate 102 to have similar thermal properties, and constructing the first and second device 104, 106 to be symmetrical so both devices have a similar sensitivity to a change in temperature. However, and as described more fully below, the first and second devices 104, 106 are substantially thermally isolated from one another. Just by way of illustration, during measurements of power from the electrical circuitry up to a power level across the first resistor of approximately 20 dBm, no substantial transfer of heat from the RF side to the DC side occurs. This approach allows the detector to be used in wide range ambient temperature with very low or negligible thermal drift in the output voltages of the first and second device 104, 106. Residual thermal drift is almost constant or can be corrected with linear variation to the ambient temperature. This approach can be referred to as a built-in thermal drift correction which eliminate the need of complex test setup and time-consuming temperature calibration and correction.

After establishing the balanced state, changes in the ambient temperature of the apparatus 100 result in substantially uniform heating of the first and second devices 104, 106. This increase in temperature across the first and second device 104, 106 will cause both $V_{TH1}$, $V_{TH2}$ to increase. This increase in temperature is substantially identical by selection of the substrate 102. Moreover, because the first and second devices 104, 106 are substantially identical, but of opposite polarities, the $V_{TH1}$, $V_{TH2}$ increase substantially. Accordingly, voltages at the first and second outputs 114, 118 have substantially the same magnitude, but opposite side. Thus, the balanced state realized upon initialization of the apparatus is maintained.

Among other benefits, the apparatus 100 is adapted to be used in a comparatively wide range of ambient temperatures with no appreciable thermal drift in the output voltages of the first and second device 104, 106. As such, the apparatus 100 provides passive thermal drift correction and significantly reduces, if not completely eliminates the need of a comparatively complex test setup and time-consuming calibration and correction to account for ambient temperature shifts that plague known devices.

Figure 2:
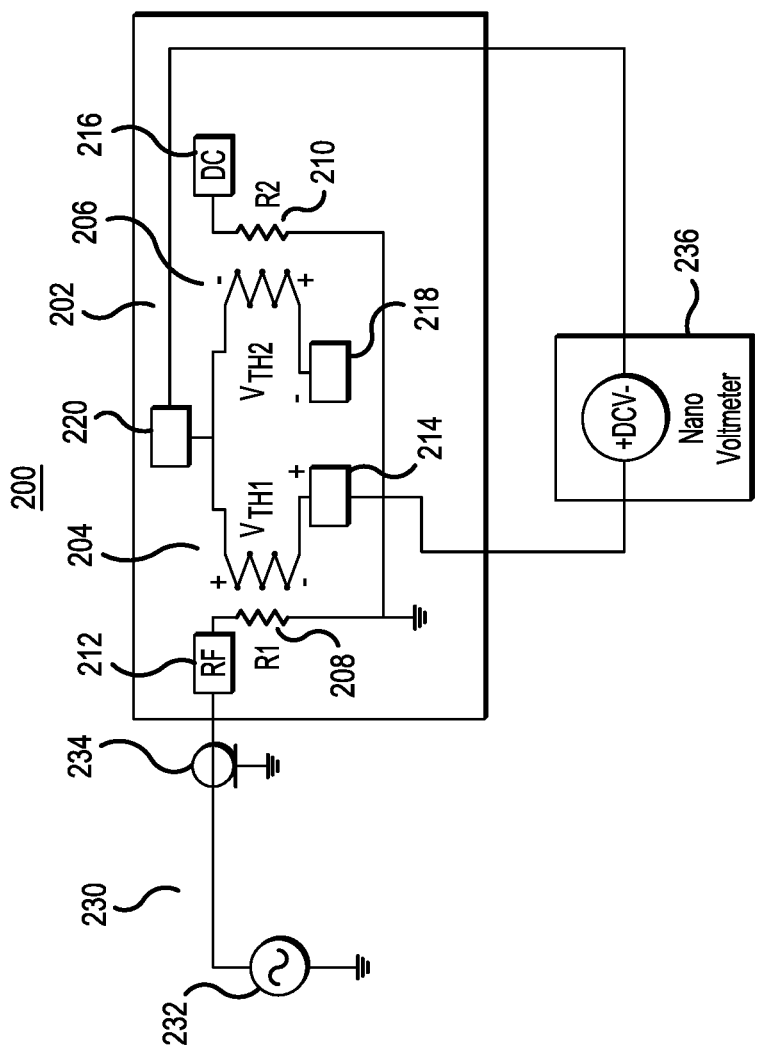
FIG. 2 is a simplified circuit diagram of an apparatus for measuring electrical power in accordance with a representative embodiment.

FIG. 2 is a simplified circuit diagram of an apparatus 200 for measuring electrical power in accordance with a representative embodiment. More particularly, the description of FIG. 2 is directed to adjusting for heat transferred from an electrical circuit 230 in accordance with a representative embodiment. Various aspects and details of apparatus 100 described in connection with FIG. 1 above may be common to those of apparatus 200. These common aspects and details may not be repeated to avoid obscuring the presently described representative embodiments.

The apparatus 200 is disposed over a substrate 202, and comprises a first device 204 adapted to convert thermal energy into a first voltage, and a second device 206 adapted to convert thermal energy into a second voltage. The substrate 202 is unitary, and is selected to have a substantially uniform coefficient of thermal conductivity, and thus heats and cools substantially equally when the ambient temperature changes. In accordance with a representative embodiment, the substrate 202 is selected from a material having the desired uniform heating/cooling, and may comprise silicon (Si), gallium arsenide (GaAs), and or gallium nitride (GaN). It is emphasized that the noted materials are merely illustrative, and other materials that provide the desired substantially uniform coefficient of thermal conductivity within the purview of one of ordinary skill in the art having the benefit of the present teachings are also contemplated. Notably, and as described more fully below, the various components depicted in FIG. 2 are disposed over the substrate 202.

The first device 204 and the second device 206 are substantially identical but have opposing polarities as described more fully below. In accordance with a representative embodiment, the first device 204 and the second device 206 are either thermopiles or thermocouples. Again, as noted above, the first and second devices 104, 106 comprise substantially identical thermocouples or thermopiles. Such substantially identical first and second devices are realized by fabricating the structures of the first and second devices 104, 106 to be symmetrical or mirror images to each other on a unity substrate (e.g., substrate 102). By fabricating the structures of the first and second devices 104, 106 this way results in the devices' having similar sensitivity to the thermal change, which is detected at the output voltage of the respective first and second devices 104, 106. Finally, it is noted that it is beneficial for the first and second resistors 108, 110 to have same magnitudes and similar temperature coefficients.

Notably, and as shown in FIG. 1, the first device 204 and the second device 206 have opposite polarities, so their voltage outputs having opposing signs. As described more fully below, this aspect of the first and second device 204, 206 is used to adjust for thermal changes caused by the ambient, heat from electrical circuitry under test, and to provide a measurement of the power from the electrical circuitry under test.

The first device 204 is disposed adjacent to a first resistor 208, and the second device 206 is disposed adjacent to a second resistor 210. Notably, the first device 204 is electrically isolated from the first resistor 208, and the second device 206 is electrically isolated from the second resistor 210. The first device 204 is disposed between a first input 212 and a first output 214. The second device 206 is connected between a second input 216 and a second output 218. A common input 120 is disposed between the first and second device 204, 206, and its function will become clearer as the present description continues.

As alluded to above, the apparatus is adapted to perform electrical measurements of an electrical circuit 230 connected to the first device 204. The electrical circuit 230 operates at comparatively high frequency electrical signal frequencies. The present teachings contemplate the apparatus 100 is adapted to perform power measurements on electrical circuits in the RF, Microwave, Millimeter Wave and sub terahertz frequency ranges. For ease of description, however, the various representative embodiments are described in connection with electrical circuits that operate in the RF band. As such, the first input 212, the first device 204, the first output 214, and the first resistor 208 disposed over the substrate 202 may be referred to as the 'RF side' of the apparatus 200. By contrast, and as described more fully below, the second input 216 is connected to a direct current (DC) source that supplies power to the second input 216 that is used to adjust the operation of the apparatus to account for ambient temperature changes, temperature changes from the electrical circuit, and to provide a measure of the power dissipated from the electrical circuit connected to the first input 212. As such, the second input 216, the second device 206, the second output 218, and the second resistor disposed over the substrate 202 may be referred to as the 'DC side' of the apparatus.

As described more fully below, maintaining the voltage between the first output 214 and the second output 218 at a balanced level results in the adjustment to account for ambient temperature changes, temperature changes to the RF side caused by the electrical circuit to which it is attached, and the measure of the power dissipated from the electrical circuit connected to the first input 212. As such, when thermal energy is transferred to the first device 204, due to the function of the first device 204, a voltage $V_{TH1}$ is established. This will alter the balanced state between the first output 214 and the second output 218. Application of a voltage $V_{TH2}$ between the first input 212 and the second output 218 having the same magnitude returns the first output 214 and the second output 218 to a balanced state.

As noted above, the first device 204 and the second device 206 are selected to be substantially identical but have opposite polarities. An initial balanced state is determined by a measure of $V_{TH1}$ and $V_{TH2}$ with no power applied from the electrical circuit connected to the first input. This is effected by constructing/disposing the substantially identical first and second devices 204, 206 over substrate 202 to have similar thermal properties, and constructing the first and second device 204, 206 to be symmetrical so both devices have a similar sensitivity to a change in temperature. However, and as described more fully below, the first and second devices 104, 106 are substantially thermally isolated from one another. Just by way of illustration, again, during measurements of power from the electrical circuit 230 up to a power level across the first resistor 208 of approximately 20 dBm, no substantial transfer of heat from the RF side to the DC side occurs. As described more fully below, this thermal isolation aids accurately adjusting for a change in thermal energy caused by the electrical circuit 230.

The electrical circuit 230 illustratively comprises a source 232 of thermal energy. Just by way of illustration, the electrical circuit 230 may comprises an RF source including an RF amplifier, or some other device under test (DUT). The source 232 is electrically connected by a connection to the apparatus 200. The electrical connection 234 generally comprises typical electrical circuitry, such as a coaxial cable signal transmission line or planar waveguide. The electrical connection 234 necessarily comprises electrically conductive materials (e.g., metals/metal alloys), which conduct not only electricity, but also thermal energy. Moreover, the components of the electrical connection when conducting electricity also generate thermal energy. This thermal energy transmitted through and generated by electrical conduction in the components of the electrical connection 234 to the first input 212 on the RF side of the apparatus 200.

The increase in thermal energy is transmitted through and generated by electrical conduction in the components of the electrical connection 234 to the first input 212, and causes an increase in temperature of the first device 204. When the temperature at the first device 204 increases, an increase in the voltage $V_{TH1}$ occurs, and is measured by the digital multimeter (DMM) 236. Notably, and as described more fully below, the DMM is comparatively accurate, and illustratively is an 8 digit device so accurate changes in $V_{TH1}$ can be measured. Because of the change in $V_{TH1}$ results in a voltage differential between first output 214 and second output 218, which when substantial enough, disturbs the balance between first output 214 and second output 218. Specifically, and as noted above the RF side and the DC side are substantially thermally isolated, and as a result, the change in temperature caused and transmitted by the electrical circuit 230 only alters the temperature of the first device 204, and not the second device 206. As such, initial balanced state that is determined by a measure of $V_{TH1}$ and $V_{TH2}$ with no power applied from the electrical circuit 230 connected to the first input 212, is disturbed. As described more fully below, this net change in voltage between the first output 214 and the second output 218, is returned to a balanced state by adjusting the voltage at the second input 216 by application of a DC voltage at the second input 216 having a magnitude equal to that measured by the DMM 236.

Figure 3:
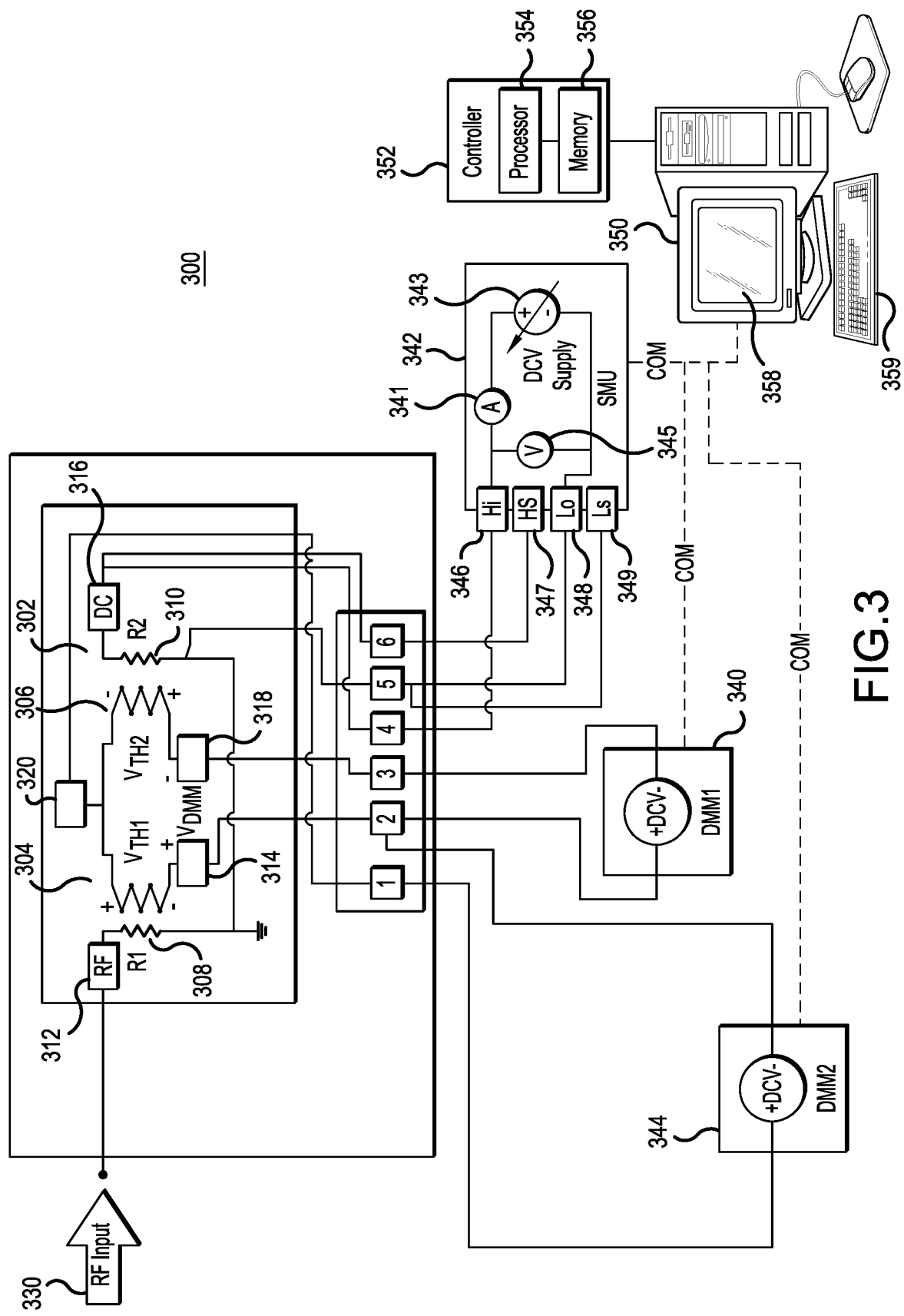
FIG. 3 is a simplified circuit diagram of a system for measuring electrical power in accordance with a representative embodiment.

FIG. 3 is a simplified circuit diagram of an system 300 for measuring electrical power in accordance with a representative embodiment. More particularly, the description of FIG. 2 is directed to adjusting for heat transferred from an electrical circuit 330 (e.g., an RF source) in accordance with a representative embodiment. Various aspects and details of apparatuses 100, 200 described in connection with FIGS. 1 and 2 above may be common to those of system 300. These common aspects and details may not be repeated to avoid obscuring the presently described representative embodiments.

The system 300 is disposed over a substrate 302, and comprises a first device 304 adapted to convert thermal energy into a first voltage, and a second device 306 adapted to convert thermal energy into a second voltage. The substrate 302 is unitary, and is selected to have a substantially uniform coefficient of thermal conductivity, and thus heats and cools substantially equally when the ambient temperature changes. In accordance with a representative embodiment, the substrate 302 is selected from a material having the desired uniform heating/cooling, and may comprise silicon (Si), gallium arsenide (GaAs), and or gallium nitride (GaN). It is emphasized that the noted materials are merely illustrative, and other materials that provide the desired substantially uniform coefficient of thermal conductivity within the purview of one of ordinary skill in the art having the benefit of the present teachings are also contemplated. Notably, and as described more fully below, the various components depicted in FIG. 2 are disposed over the substrate 302.

The first device 304 and the second device 306 are substantially identical but have opposing polarities as described more fully below. In accordance with a representative embodiment, the first device 304 and the second device 306 are either thermopiles or thermocouples. Notably, and as shown in FIG. 1, the first device 304 and the second device 306 have opposite polarities, so their voltage outputs having opposing signs. As described more fully below, this aspect of the first and second device 304, 306 is used to adjust for thermal changes caused by the ambient, heat from electrical circuitry under test, and to provide a measurement of the power from the electrical circuitry under test.

The first device 304 is disposed adjacent to a first resistor 308, and the second device 306 is disposed adjacent to a second resistor 320. Notably, the first device 304 is electrically isolated from the first resistor 308, and the second device 306 is electrically isolated from the second resistor 310. The first device 304 is disposed between a first input 312 and a first output 314. The second device 306 is connected between a second input 316 and a second output 318. A common input 120 is disposed between the first and second device 304, 306, and its function will become clearer as the present description continues.

As alluded to above, the apparatus is adapted to perform electrical measurements of an electrical circuit 330 connected to the first device 304, and may be a circuit that operates at RF frequencies. As such, the first input 312, the first device 304, the first output 314, and the first resistor 308 disposed over the substrate 302 may be referred to as the 'RF side' of the system 300. By contrast, and as described more fully below, the second input 316 is connected to a direct current (DC) source that supplies power to the second input 316 that is used to adjust the operation of the apparatus to account for ambient temperature changes, temperature changes from the electrical circuit, and to provide a measure of the power dissipated from the electrical circuit connected to the first input 312. As such, the second input 316, the second device 306, the second output 318, and the second resistor disposed over the substrate 302 may be referred to as the 'DC side' of the apparatus.

As described more fully below, maintaining the voltage between the first output 314 and the second output 318 at a balanced level results in the adjustment to account for ambient temperature changes, temperature changes to the RF side caused by the electrical circuit to which it is attached, and the measure of the power dissipated from the electrical circuit connected to the first input 312. As such, when thermal energy is transferred to the first device 304, due to the function of the first device 304, a voltage $V_{TH1}$ is established. This will alter the balanced state between the first output 314 and the second output 318. Application of a voltage $V_{TH2}$ between the second input 316 and the second output 318 having the same magnitude returns the first output 314 and the second output 318 to a balanced state.

As noted above, the first device 304 and the second device 306 are selected to be substantially identical but have opposite polarities. An initial balanced state is determined by a measure of $V_{TH1}$ and $V_{TH2}$ with no power applied from the electrical circuit connected to the first input. This is effected by constructing/disposing the substantially identical first and second devices 304, 306 over substrate 302 to have similar thermal properties, and constructing the first and second device 304, 306 to be symmetrical so both devices have a similar sensitivity to a change in temperature. However, and as described more fully below, the first and second devices 304, 306 are substantially thermally isolated from one another. Just by way of illustration, again, during measurements of power from the electrical circuit 330 up to a power level across the first resistor 308 of approximately 20 dBm, no substantial transfer of heat from the RF side to the DC side occurs. As described more fully below, this thermal isolation aids accurately adjusting for a change in thermal energy caused by the electrical circuit 330.

The system 300 is adapted to measure the power from the electrical circuit 330 as described more fully below. Just by way of illustration, the source may comprises an RF source including an RF amplifier, or some other device under test (DUT). The electrical circuit 330 is electrically connected by a connection to the system 300. Again, the electrical connection generally comprises typical electrical circuitry, such as a coaxial cable signal transmission line or planar waveguide. The electrical connection necessarily comprises electrically conductive materials (e.g., metals/metal alloys), which conduct not only electricity, but also thermal energy. Moreover, the components of the electrical connection when conducting electricity also generate thermal energy. This thermal energy transmitted through and generated by electrical conduction in the components of the electrical connection to the first input 312 on the RF side of the system 300.

The system also comprises a source measurement unit (SMU) 342 comprising a direct current (DC) voltage source 343 and a DC voltmeter 345. As described more fully below, the SMU 342 measures current through the second resistor 310, and the voltage applied to maintain balance between the first output 314 and second output 318 by providing a third voltage to the second input 316. As will be appreciated, by having a measure of both the current through and voltage across the second resistor 310, a measure of the power needed to maintain the balanced state between the first output 314 and second output 318. As described more fully below, the power required to maintain the balanced state is substantially equal to the output power of the source. This balanced state and the power measurements are effected by a computer system 350. The computer system 350 is adapted to receive measurements from the first DMM 340, and thus from the first and second outputs 314, 318, and stores and processes the measurements data according to representative embodiments described herein. The computer system 350 comprises a controller 352, a processor 354, a memory 356, and a display 358 which may in turn comprise a graphical user interface (GUI) (not shown), and a user interface 359.

The memory 356 stores instructions executable by the processor 354 of the controller 352. When executed, and as described more fully below, the instructions cause the processor to adjust the power on the DC side to return the balanced state between the first output 314 and the second output 318. Moreover, and again as discussed more fully below, the processor 354 is adapted to receive voltage and current data from the SMU 342 to determine the power output from the electrical circuit 330.

The memory 356 may include a main memory and/or a static memory, where such memories may communicate with each other and the controller 352 via one or more buses. The memory 356 stores instructions used to implement some or all aspects of methods and processes described herein.

The memory 356 may be implemented by any number, type and combination of random access memory (RAM) and read-only memory (ROM), for example, and may store various types of information, such as software algorithms, which serves as instructions, which when executed by a processor cause the processor to perform various steps and methods according to the present teachings. Furthermore, updates to the methods and processes described herein may also be provided to the computer system 350 and stored in memory 356.

The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, Blu-ray disk, a universal serial bus (USB) drive, or any other form of storage medium known in the art. The memory 130 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 356 may store software instructions and/or computer readable code (collectively referred to as 'instructions') that enable performance of various functions of the system 300. The memory 356 may be secure and/or encrypted, or unsecure and/or unencrypted.

"Memory" is an example of computer-readable storage media, and should be interpreted as possibly being multiple memories or databases. The memory or database for instance may be multiple memories or databases local to the computer, and/or distributed amongst multiple computer systems or computing devices, or disposed in the 'cloud' according to known components and methods. A computer readable storage medium is defined to be any medium that constitutes patentable subject matter under 35 U.S.C. § 101 and excludes any medium that does not constitute patentable subject matter under 35 U.S.C. § 101. Examples of such media include non-transitory media such as computer memory devices that store information in a format that is readable by a computer or data processing system. More specific examples of non-transitory media include computer disks and non-volatile memories.

The controller 352 is representative of one or more processing devices, and is configured to execute software instructions stored in memory 356 to perform functions as described in the various embodiments herein. The processor 354 may be implemented by field programmable gate arrays (FPGAs), application specific integrated circuits (ASICs), systems on a chip (SOC), a general purpose computer, a central processing unit, a computer processor, a microprocessor, a graphics processing unit (GPU), a microcontroller, a state machine, programmable logic device, or combinations thereof, using any combination of hardware, software, firmware, hard-wired logic circuits, or combinations thereof. Additionally, any processing unit or processor herein may include multiple processors, parallel processors, or both. Multiple processors may be included in, or coupled to, a single device or multiple devices.

The term "processor" as used herein encompasses an electronic component able to execute a program or machine executable instruction. References to a computing device comprising "a processor" should be interpreted to include more than one processor or processing core, as in a multi-core processor. A processor may also refer to a collection of processors within a single computer system or distributed among multiple computer systems, such as in a cloud-based or other multi-site application. The term computing device should also be interpreted to include a collection or network of computing devices each including a processor or processors. Modules have software instructions to carry out the various functions using one or multiple processors that may be within the same computing device or which may be distributed across multiple computing devices.

Referring again to the computer system 350 and the SMU 342, the adjustment of the voltage on the DC side of the system 300 caused by changes in thermal energy to return the first and second outputs to a balanced state, and to determine the power from the electrical circuit 330 are described.

As noted above, a change in the ambient temperature will result in a substantially identical change of $V_{TH1}$ and $V_{TH2}$, and the voltage across the first and second outputs 314, 318 is returned to the balanced state.

By contrast, and as described above, a change in temperature on the RF side of the system 300 causes a change in the voltage drop $V_{TH1}$, and a commensurate change in the balance state of the first and second outputs 314, 318. This is measured by the first DMM 340. By applying a voltage to the DC side, the voltage differential between the first and second outputs 314, 318 can be restored to the balanced state. This voltage is applied by the DC voltage source 343 through connections 6 and 5, which are connected to contacts 347 and 349. Notably, instructions stored in memory 356 are executed by the processor 354 to determine the required voltage to return the apparatus to the balanced state, and to change the voltage applied to the second input by this required voltage amount. In this way, changes in the voltage across the first and second outputs 314, 318 caused by changes in thermal energy from the electrical circuit 330, can be accounted for, and return the system 300 to the balanced state. Stated somewhat differently, a change in the voltage across the first and second outputs 314, 318 to an unbalanced state is returned to a balanced state after calculations by the processor 354 executing instructions stored in memory 356, and application of a new voltage from the DC voltage source 343 of the SMU 342 through the connection between the computer system 350 and the SMU 342. Notably, however, the change in voltage caused by an increase in temperature on the RF side caused by operation of electrical circuit 330 is also measured by the second DMM 340 connected through connections 2, 3 to the first and second outputs 314, 318. Notably, it is also possible to use data from the second DMM 344 to established the balanced state between first and second contacts 314, 318 in a DC substitution measurement method. As such, the reading from the second DMM 344 can also be used to measure the RF power from the electrical circuit 330 based on a lookup table or conversion table stored in memory 356. The processor 354 can thus determine the RF power from the electrical circuit 330 by accessing this lookup table or conversion chart. Changes in the thermal energy caused by changes in electrical power from the electrical circuit 330 are measured as follows. As noted above, a change in the output power from the electrical circuit 330 will result in a change in the thermal energy from the first resistor 308, and the voltage $V_{TH1}$ across the first device correspondingly changes. This results in a change in the voltage across the first and second outputs 314, 318, which is measured by the first DMM 340. Again, instructions stored in memory 356 are executed by the processor 354 to determine the required voltage to return the apparatus to the balanced state, and to change the voltage applied to the second input by this required voltage amount. In this way, changes in the voltage across the first and second outputs 314, 318 caused by changes in the power output from the electrical circuit 330 (and the commensurate change in the voltage $V_{TH1}$ caused by the change in thermal energy from the electrical circuit 330) can be accounted for, and return the system 300 to the balanced state. Notably, the SMU further comprises ammeter 341 and DC voltmeter 345. The ammeter 341 and the DC voltmeter 345 are connected at contacts 346, 348, and as shown from the connections 5 and 6 respectively, measure the voltage and current through the second resistor 310. Based on these readings a change in the power on the DC side required to return the system to the balanced state between the first and second outputs is determined. Because the first and second devices 304, 306, the first and second resistors 308, 310 are substantially identical, the change in the power across the DC side is substantially the same as the power across the RF side. So, by determining the power across the DC side, the power across the RF side is readily determined. Again, these determinations may be made by the processor 354 executing instructions stored in memory 356.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. An apparatus for measuring electrical power, comprising:
   a substrate;
   a first device adapted to convert thermal energy into a first voltage, the first device comprising a first thermopile or a first thermocouple, the first device having a first input and a first output, the first device being disposed over the substrate adjacent to a first resistor;
   a second device adapted to convert thermal energy into a second voltage, the second device comprising a second thermopile or a second thermocouple, the second device having a second input and a second output, the second device being disposed over the substrate adjacent to a second resistor, wherein the first output and the second output have opposite polarities; and
   a source measurement unit comprising a direct current (DC) voltage source and a DC voltmeter connected to the second resistor, wherein the source measurement unit provides a third voltage to the second resistor to maintain a voltage between the first and second outputs at a balanced level.

2. The apparatus of claim 1, wherein the first resistor is connected to an electrical source that causes a temperature change across the first resistor and the source measurement unit is adapted to change the third voltage across the second resistor to return the voltage between the first and second outputs to the balanced level.

3. The apparatus of claim 2, wherein a change in the third voltage across the second resistor is proportional to a change in output power of the electrical source.

4. The apparatus of claim 3, wherein the electrical source comprises a radio frequency (RF) circuit, and a voltage change across the second resistor is proportional to a change in output power of the RF source.

5. The apparatus of claim 1, wherein a change in an ambient temperature causes a substantially uniform temperature change across the substrate, and a change in a voltage across the first device caused by the change in the ambient temperature is compensated by application of a voltage across the second resistor to return the voltage between the first and second outputs at the balanced level.

6. The apparatus of claim 1, wherein the substrate has a substantially uniform coefficient of thermal conductivity.

7. The apparatus of claim 6, wherein the substrate comprises silicon, gallium arsenide (GaAs), and/or gallium nitride (GaN).

8. The apparatus of claim 1, wherein a change in a temperature caused by an electrical circuit connected to the first resistor causes a change in the first voltage, which is compensated by application of the third voltage across the second resistor to return the voltage between the first and second outputs at the balanced level.

9. The apparatus of claim 1, wherein the first and second devices adapted to convert thermal energy are substantially thermally isolated from one another.

10. The apparatus of claim 1, wherein the first and second devices adapted to convert thermal energy are thermally isolated from one another up to a power level across the first resistor of approximately 20 dBm.

11. A system for measuring electrical power of an electrical circuit, the system comprising:
    a controller comprising a processor;
    a tangible, non-transitory computer-readable medium that stores instructions;
    a substrate;
    a first device adapted to convert thermal energy into a first voltage, the first device comprising a first thermopile or a first thermocouple, the first device having a first input and a first output, the first device being disposed over the substrate adjacent to a first resistor;
    a second device adapted to convert thermal energy into a second voltage, the second device comprising a second thermopile or a second thermocouple, the second device having a second input and a second output, the second device being disposed over the substrate adjacent to a second resistor, wherein the first output and the second output have opposite polarities; and
    a source measurement unit comprising a direct current (DC) voltage source and a DC voltmeter connected to the second resistor, wherein the instructions, when executed by the processor cause the source measurement unit to provide a third voltage to the second resistor to maintain a voltage between the first and second outputs at a balanced level.

12. The system of claim 11, wherein the first resistor is connected to an electrical source that causes a temperature change across the first resistor and the source measurement unit is adapted to provide a voltage change across the second resistor to return the voltage between the first and second outputs to the balanced level.

13. The system of claim 12, wherein the voltage change across the second resistor is proportional to a change in output power of the electrical source.

14. The system of claim 13, wherein the electrical source comprises a radio frequency (RF) circuit, and the voltage change across the second resistor is proportional to a change in output power of the RF source.

15. The system of claim 11, wherein a change in an ambient temperature causes a substantially uniform temperature change across the substrate, wherein the instructions further cause a voltage to be applied by the source measurement unit across the second resistor that compensates for the change in the ambient temperature to return the voltage between the first and second outputs at the balanced level.

16. The system of claim 11, wherein the substrate has a substantially uniform coefficient of thermal conductivity.

17. The system of claim 16, wherein the substrate comprises silicon, gallium arsenide, (GaAs), and/or gallium nitride (GaN).

18. The system of claim 11, wherein a change in a temperature caused by an electrical circuit connected to the first resistor causes a change in the first voltage across the first device, which is compensated by application of the third voltage across the second resistor to return the voltage between the first and second outputs at the balanced level.

19. The system of claim 11, wherein the first and second devices are substantially thermally isolated from one another.

20. The system of claim 11, wherein the first device and the second device are thermally isolated from one another up to a power level across the first resistor of approximately 20 dBm.

* * * * *